United States Patent
Chu

(10) Patent No.: US 11,152,947 B2
(45) Date of Patent: Oct. 19, 2021

(54) FEEDBACK CONTROL FOR ACCURATE SIGNAL GENERATION

(71) Applicant: Renesas Electronics America Inc., Milpitas, CA (US)

(72) Inventor: Min Chu, Milpitas, CA (US)

(73) Assignee: Renesas Electronics America Inc., Milpitas, CA (US)

( * ) Notice: Subject to any disclaimer, the term of this patent is extended or adjusted under 35 U.S.C. 154(b) by 0 days.

(21) Appl. No.: 16/280,196

(22) Filed: Feb. 20, 2019

(65) Prior Publication Data
US 2020/0266823 A1    Aug. 20, 2020

(51) Int. Cl.
| | |
|---|---|
| *H03L 7/00* | (2006.01) |
| *H03L 7/14* | (2006.01) |
| *H03L 7/07* | (2006.01) |
| *H03L 7/091* | (2006.01) |
| *H03L 7/107* | (2006.01) |
| *H04J 3/06* | (2006.01) |

(52) U.S. Cl.
CPC ............... *H03L 7/146* (2013.01); *H03L 7/07* (2013.01); *H03L 7/091* (2013.01); *H03L 7/107* (2013.01); *H04J 3/0688* (2013.01)

(58) Field of Classification Search
CPC .......... H03L 7/146; H03L 7/091; H03L 7/07; H03L 7/107; H04J 3/0688
USPC ........................................ 331/1 R, 2, 11, 18
See application file for complete search history.

(56) References Cited

U.S. PATENT DOCUMENTS

| | | | |
|---|---|---|---|
| 5,059,925 A * | 10/1991 | Weisbloom | ............... H03L 7/18 331/1 A |
| 5,122,677 A | 6/1992 | Sato | |
| 5,726,607 A | 3/1998 | Brede et al. | |
| 6,741,109 B1 * | 5/2004 | Huang | ..................... H03L 7/081 327/148 |
| 7,202,717 B2 | 4/2007 | Keaveney et al. | |
| 8,947,139 B1 | 2/2015 | Vercesi et al. | |
| 2001/0015678 A1 | 8/2001 | Wesolowski | |
| 2010/0123496 A1 | 5/2010 | Palmer et al. | |
| 2015/0180409 A1 | 6/2015 | Van Den Berg et al. | |
| 2016/0164532 A1* | 6/2016 | Zhang | ..................... H03L 7/183 327/142 |
| 2018/0145696 A1 | 5/2018 | Sarda | |
| 2019/0007055 A1 | 1/2019 | Nelson | |

OTHER PUBLICATIONS

Raja K. K. R. Sandireddy et al., "A Generic Architecture for Multi-Modulus Dividers in Lower-Power and High-Speed Frequency Synthesis," 2004 Topical Meeting on Silicon Monolithic Integrated Circuits in RF Systems, IEEE. 2004. pp. 1-4.

(Continued)

*Primary Examiner* — Richard Tan
(74) *Attorney, Agent, or Firm* — Haynes and Boone, LLP

(57) ABSTRACT

A phase-locked loop (PLL) performs hitless switching from a first reference clock (ref1) to a second reference clock (ref2) by entering holdover mode (418), and aligning the feedback clock (fbclk) to the second reference clock while in holdover mode. The alignment is performed by adjusting a divisor input (D) for the multi-mode divider (128) that divides the output clock frequency (PLLout) to generate the feedback clock. Other features are also provided.

20 Claims, 6 Drawing Sheets

(56) References Cited

OTHER PUBLICATIONS

Marco Cassia et al., "A Spur-Free Fractional-N ΣΔ PLL for GSM Applications: Linear Model and Simulations," IEEE, 2003. pp. 1-5.
Ian Galton, "Delta-Sigma Fractional-N Phase-Locked Loops," https://semanticscholar.org/paper/delta-sigma-fractional-n-phase-locked-loops-galton/f83c1d67a5532e84904a0c550d9594a57fda6bee, 2017, pp. 1-11.
Alaa Hussein, "Design and Analysis of Fractional-N Frequency Synthesizers for Wireless Communication," Thesis presented to the University of Waterloo in fulfillment of the thesis requirement for the degree of Doctor of Philisophy in Electrical and Computer Engineering. Waterloo, Ontario, Canada. 2002. pp. 1-171.
Fancesco Barale, "Frequency Dividers Design for Multi-GHz PLL Systems," Georgia Institute of Technology. Aug. 2008. pp. 1-50.
Integrated Device Technology, Inc., "Four-Channel Universal Frequency Translator," 8A34043 Datasheet. Nov. 19, 2018. pp. 1-84.
Integrated Device Technology, Inc., "FemtoClock NG Jitter Attenuator and Clock Synthesizer," 8V19N492 Datasheet. Sep. 19, 2018. pp. 1-74.
Texas Instruments, "Fractional/Integer-N PLL Basics," Technical Brief SWRA029, Wireless Communication Business Unit. Aug. 1999. pp. 1-55.
Communication and European Search Report dated Jul. 24, 2020 from European Application No. 20157716.0, pp. 1-10.

* cited by examiner

FEEDBACK CONTROL FOR ACCURATE SIGNAL GENERATION

BACKGROUND OF THE INVENTION

The present invention relates to electrical circuits, and more particularly to phase locked loops (PLL).

PLLs are widely used for clock generation in electronic circuits, especially where flexibility is needed in setting the clock frequencies and other electrical parameters. FIG. 1 shows an exemplary PLL 120 generating a clock signal $PLL_{out}$ from a reference clock signal refclk provided by a crystal oscillator circuit 110 including a piezo-electric crystal 114 and a temperature-compensated amplifier circuit 116. The output $PLL_{out}$ is fed back into the PLL for comparison with refclk to correct any phase/frequency errors in $PLL_{out}$ generation. In addition, the feedback path can be used for frequency multiplication to make the $PLL_{out}$ frequency to be a multiple of refclk frequency if desired.

Specifically, frequency divider 128 divides the $PLL_{out}$ frequency by some divisor N, which can be integer or fractional. The divider output, fbclk, is provided to Phase/Frequency Detector (PFD) 136, which also receives refclk. The PFD generates an error signal representing a phase/frequency difference between refclk and fbclk. The error signal is converted, by charge pump (CP) 140, to a voltage Vctrl that controls the voltage-controlled oscillator (VCO) 150 to generate the $PLL_{out}$ signal in such a way as to minimize the phase/frequency difference between refclk and fbclk. Of note, since the fbclk frequency is equal to the $PLL_{out}$ frequency divided by N, the $PLL_{out}$ frequency is N times greater than refclk. See for example U.S. Pat. No. 7,202,717, issued Apr. 10, 2007, incorporated herein by reference.

Low pass filter 154 is interposed between CP 140 and VCO 150 to improve the $PLL_{out}$ stability.

The PLL can also use digital circuitry. See for example U.S. Pat. No. 8,947,139, issued Feb. 3, 2015, incorporated herein by reference.

In various applications (automotive being one of them), redundant reference clocks are needed to improve reliability/safety of the systems. An example is shown in FIG. 2, where two crystal oscillators 110.1, 110.2 are multiplexed to provide refclk to PLL 120. More particularly, the oscillators 110.1, 110.2 generate respective clocks ref1, ref2. Multiplexer 210 selects one of these clocks based on a selection signal 214, and provides the selected clock to the PLL's refclk input. If one of the two oscillators 110 fails, the selection signal 214 selects the other oscillator. See, for example, U.S. Pat. No. 5,122,677, issued 16 Jun. 1992 to Sato, incorporated herein by reference.

If the outputs of two oscillators 110 are phase-aligned, the oscillator switching can be hitless, i.e. with minimum disruption/down time of refclk and $PLL_{out}$. However, the oscillators 110 are often not in phase even if they are enabled at the same time. This is because their crystals 114 are usually cut slightly differently, and because of other mismatches (layout mismatches, location in different parts of the die, etc.). With an unknown/arbitrary phase between the two crystals, switching from one oscillator 110 to the other will introduce a phase offset to the PLL, which may disturb the down-stream signals, possibly causing the electronics to crash. In particular, the PLL 120 may lose lock and stop functioning.

According to the Sato patent referenced above, the outputs of oscillators 110 can be phase-aligned by additional circuitry (not shown) before being provided to MUX 210. The phase alignment is maintained at all times, so the clock switching is hitless.

SUMMARY

This section summarizes some features of the invention. Other features may be described in the subsequent sections. The invention is defined by the appended claims, which are incorporated into this section by reference.

Some embodiments of the present invention facilitate hitless or near hitless reference clock switching regardless of whether or not the reference clocks are aligned at all times. For example, suppose the PLL needs to switch from ref1 (i.e. oscillator 110.1) to ref2. First, the PLL is put in holdover mode, in which the output $PLL_{out}$ is decoupled from the oscillators 110 and held at a constant frequency. Divider 128 is replaced by a multi-mode divider, and during the holdover the divider's input N (the divisor) becomes adjusted, in a feedback loop, to align fbclk with the new reference ref2. When alignment has been achieved, the holdover mode is ended, and the PLL is operated from ref2. In some embodiments, the PLL disturbance is reduced as a result of the alignment performed in holdover mode.

Further, in some embodiments, the clocks ref1 and ref2 may have different frequencies. Also, the divisor N may have different values depending on whether refclk is ref1 or ref2.

Some PLL embodiments of the present invention can be combined with other techniques, e.g. the techniques described in the Sato patent.

The invention is not limited to the features or advantages described above except as defined by the appended claims.

DESCRIPTION OF SOME EMBODIMENTS

The embodiments described in this section illustrate but do not limit the invention. The invention is defined by the appended claims.

Figure 2:
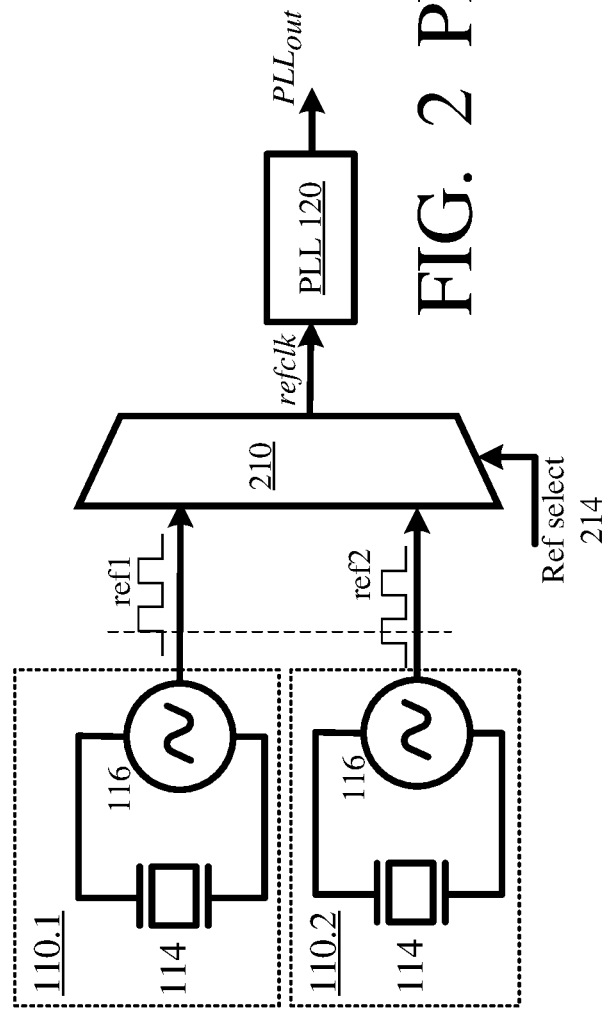
Figure 3:
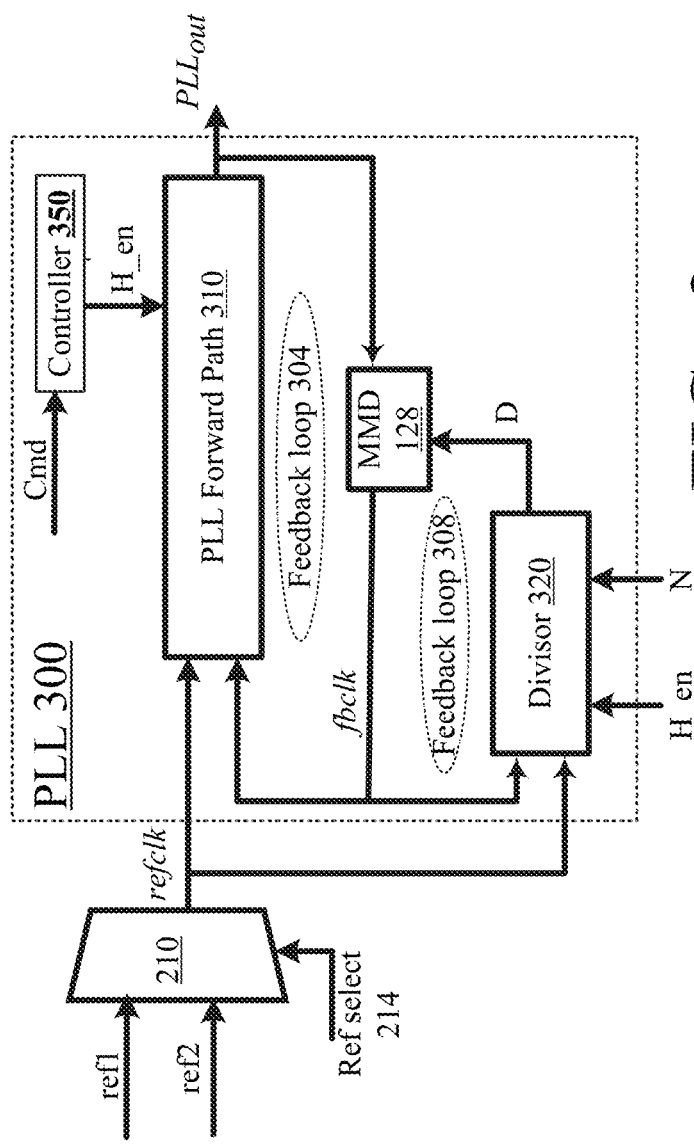
FIG. 3 is a block diagram of a clock generator according to some embodiments of the present invention.

FIG. 3 illustrates a clock generator including a PLL 300 according to some embodiments of the present invention. Oscillators 110 and MUX 210 can be as in FIG. 2 or of some other kind, to provide a reference signal refclk based on a select signal 214. Signal 214 can be generated as in FIG. 2, to switch the oscillators 110 when the currently selected oscillator signal becomes inadequate. See for example the Sato patent.

PLL 300 includes two feedback loops: 304 and 308. These loops share a multi-mode divider (MMD) 128. In loop 308, divisor circuit 320 provides a digital divisor output (D) to MMD 128. In normal operation, loop 308 is open, and the divisor D can be generated as a fixed value N, as in FIG. 2. Loop 304 is closed, to operate possibly as in FIG. 2.

In holdover mode, loop 304 is open, and loop 308 is closed to control the divisor D to align the fbclk clock with refclk. But refclk is switched to a new reference clock, so fbclk is in fact aligned with the new reference clock in holdover. The PLL output $PLL_{out}$ is maintained at a constant frequency, and is isolated from the refclk input in holdover mode; the $PLL_{out}$ isolation from refclk can be performed as in prior art or in some other way; see for example U.S. Pat. No. 5,726,607, issued Mar. 10, 1998, incorporated herein by reference; and U.S. Pre-Grant Patent Publications US 2010/0123496 A1, US 2015/0180409 A1, and US 2019/0007055 A1, all incorporated herein by reference.

Each of loops 304, 308 can be analog, digital, or hybrid (mix of analog and digital circuits). For illustration purposes, in some examples described below, loop 304 is analog and loop 308 is digital.

Figure 4:
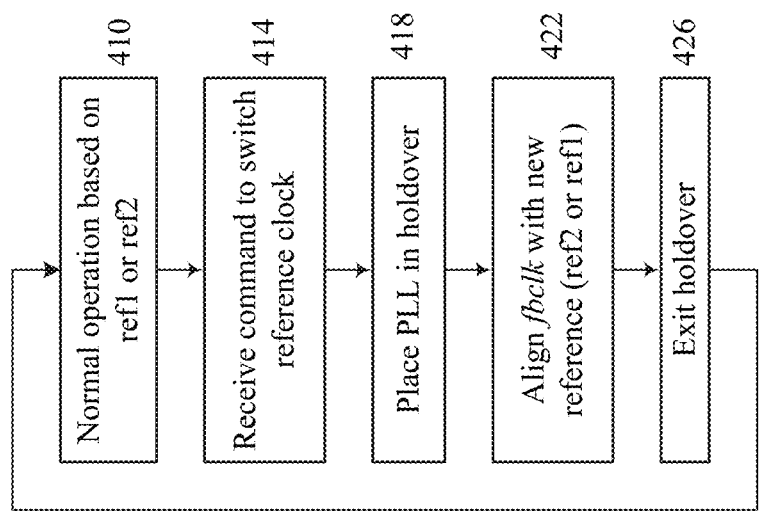
FIG. 4 is a flowchart of clock generator operation according to some embodiments of the present invention.

PLL 300 is placed in holdover mode by asserting a holdover-enable signal H_en generated by PLL controller 350. In normal operation (step 410 in FIG. 4), holdover enable signal H_en is deasserted; divisor circuit 320 provides a digital divisor signal D=N to MMD 128. The PLL operates as in FIG. 2 or some other manner, based on the selected reference clock, e.g. ref1. Loop 304 is closed, and loop 308 is open.

At step 414, controller 350 receives a command ("CMD") to switch the reference clock from ref1 to ref2 or vice versa. The command can be triggered by malfunction of the current reference (e.g. ref1), or manually, or in some other way.

In response (step 418), controller 350 asserts the signal H_en to place the PLL in holdover mode. Loop 304 is broken to cause the PLL output $PLL_{out}$ to be independent of refclk. Loop 308 is closed.

Also, oscillator select signal 214 is changed to select the new reference ref2. MUX 210 provides the new reference as refclk.

While in holdover (step 422), loop 308 operates to align the feedback clock fbclk with the new reference, now provided as refclk. Specifically, divisor circuit 320 compares refclk with fbclk, and outputs a divisor D to reduce misalignment between refclk and fbclk.

When the alignment has been achieved (possibly as determined by divisor circuit 320), controller 350 deasserts the signal H_en to exit the holdover mode (step 426). The clock generator returns to normal operation (step 410) with the new reference clock being selected.

Figure 5:
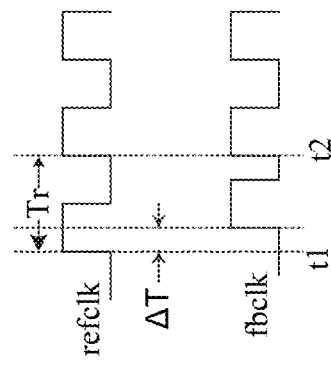
FIG. 5 is a timing diagram illustrating holdover mode operation according to some embodiments of the present invention.

FIG. 5 illustrates divisor circuit 320 operation in some embodiments. A rising edge of reference clock refclk occurs at a time t1, when refclk leads fbclk by some time ΔT. Let D1 denote the divisor D value at time t1. By a later time t2, divisor circuit 320 changes the D value to another value D2 so as to reduce the feedback clock period by ΔT. As a result, at time t2, the refclk and fbclk rising edges are aligned.

In some embodiments, divisor circuit 320 determines D2 as follows. Let Tr and $f_r$ denote, respectively, the period and frequency of the reference clock refclk (i.e. the new reference; of note, ref1 and ref2 may or may not have the same frequency). Then:

$$t2 = t1 + Tr = t1 + 1/f_r \qquad (1)$$

Let T1 denote the fbclk period at time t1, and T2 denote the fbclk period after time t1, and in particular at time t2. Then in order for the refclk and fbclk rising edges to be aligned at the time t2, the following relation is needed:

$$t2 = t1 + \Delta T + T2 \qquad (2)$$

Equations (1) and (2) mean that:

$$T2 = Tr - \Delta T \qquad (3)$$

Let $f_{out}$ denote the frequency of PLL output $PLL_{out}$. Due to MMD 128, the fbclk period T2 at time t2 should be $D2/f_{out}$:

$$T2 = D2/f_{out}$$

Combining this with equation (3), we obtain:

$$D2 = f_{out} * (Tr - \Delta T) \qquad (4)$$

In some embodiments, divisor circuit 320 measures ΔT at time t1+ΔT or shortly thereafter, and immediately sets the divisor D output to D2 per equation (4).

In some embodiments, in holdover, the PLL output frequency four is maintained at the same value as immediately before the holdover, i.e.

$$f_{out} = 1/Tr_0 * N \qquad (5)$$

where $Tr_0$ is the refclk period before the holdover. Also, in some embodiments, ref1 and ref2 have the same frequency, i.e. $Tr = Tr_0$. In such cases, equation (5) implies that $f_{out}*Tr = N$, so equation (4) can be re-written as:

$$D2 = N - f_{out} * \Delta T \qquad (6)$$

In such cases, divisor circuit 320 determines D2 per equation (6).

The above equations assume that refclk leads fbclk. But if, at any time, fbclk leads refclk, then equation (4) can be replaced by:

$$D2 = f_{out} * (Tr + \Delta T) \qquad (4')$$

where ΔT is the time from the rising edge of fbclk to the rising edge of refclk. Similarly, equation (6) can be replaced by:

$$D2 = N + f_{out} * \Delta T \qquad (6')$$

In some embodiments, divisor circuit 320 measures the times ΔT between every two consecutive rising edges of refclk and fbclk. For each two consecutive ΔT values, circuit 320 determines the smallest value. If the smallest ΔT value is from the rising edge of refclk to the rising edge of fbclk, then circuit 320 uses equation (4) or (6); otherwise equation (4') or (6') is used.

Other techniques can also be used to determine the D value, including programmable-integral-differential control or other types of techniques.

In some embodiments, circuit 320 uses a microprocessor to calculate the divisor D2 using any techniques described above.

Figure 6:
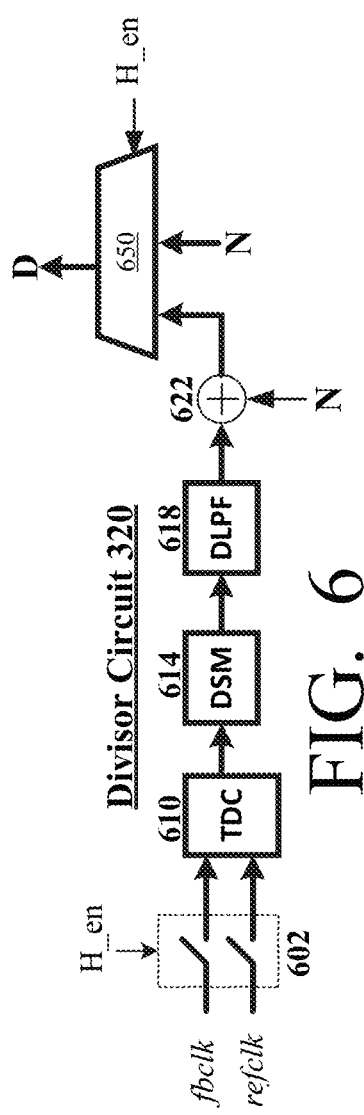
FIGS. 6, 7, 8 illustrate clock generator circuits according to some embodiments of the present invention.

FIG. 6 shows an exemplary non-microprocessor embodiment of divisor circuit 320 for the case of equations (6), (6'), i.e. when the reference clocks ref1 and ref2 have the same frequency. The circuit of FIG. 6 assumes that N is an integer. Switches 602, controlled by the H_en signal, close the loop 308 in holdover mode, connecting the fbclk and refclk signals to a time-to-digital converter (TDC) 610. TDC 610 calculates the values $f_{out} * \Delta T$ and/or the negatives of these values, per equation (6') or (6) respectively. Delta-sigma modulator (DSM) 614 converts the possibly fractional TDC output to a stream of integers whose average is equal to the TDC output. See for example the following documents, incorporated herein by reference: Raja K. K. R. Sandireddy et. al., "A Generic Architecture for Multi-Modulus Dividers in Low-Power and High-Speed Frequency Synthesis" 2004 Topical Meeting on Silicon Monolithic Integrated Circuits in RF Systems, IEEE, 2004; Marco Cassia et al., "A SPUR-FREE FRACTIONAL-N EA PLL FOR GSM APPLICATIONS: LINEAR MODEL AND SIMULATIONS", IEEE, 2003; Ian Galton, "Delta-Sigma Fractional-N Phase-Locked Loops", https://www.semanticscholar.org/paper/Delta-Sigma-Fractional-N-Phase-Locked-Loops-Galton/f83c1d67a5532e84904a0c550d9594a57fda6bee (2017).

Digital low-pass filter (DLPF) 618 removes high-frequency components from the DSM output to improve the D signal stability. Adder 622 adds the N value to the DSM output per equation (6) or (6'). The adder output is coupled by multiplexer 650 to the D output; MUX 650 selects the adder 622 output when H_en is asserted. The D output is connected to MMD 128. In some embodiments, TDC 610, DSM 615, DLPF 618, and adder 622 are conventional circuits.

When H_en is deasserted (normal mode), multiplexer 650 provides the N value to the D output. In some embodiments, the N value is different depending on which of the ref1 and ref2 clocks is selected by MUX 210.

Figure 7:
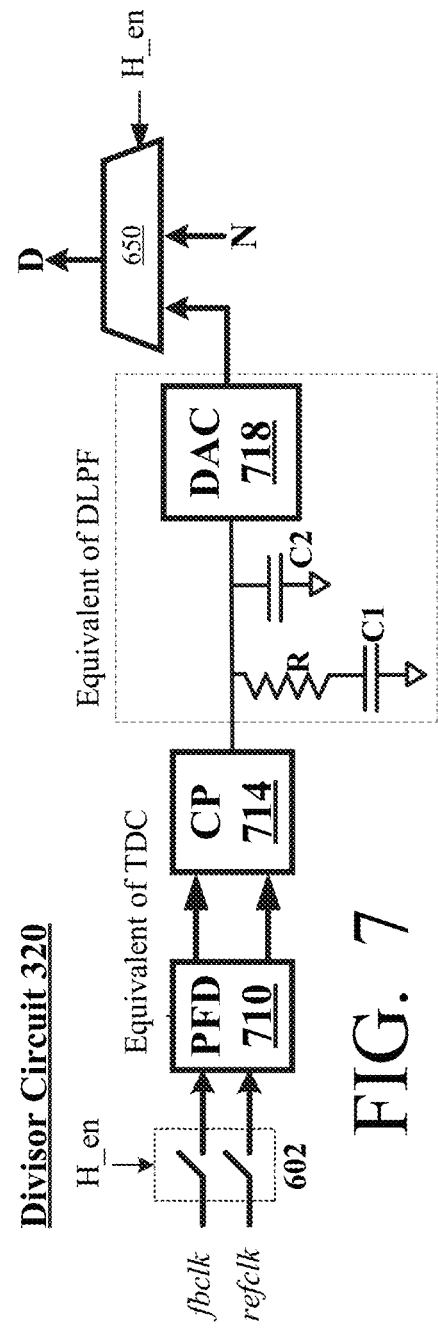

FIG. 7 illustrates another, part-analog example of divisor circuit 320. Switches 602 are as in FIG. 6, to couple the fbclk and refclk signals to PFD 710 when H_en is asserted. PFD 710 then provides the phase/frequency error signal to charge pump 714. PFD 710 and CP 714 act like a TDC. A low pass filter is provided at the CP 714 output by: a resistor R connected to the output of CP 714; a capacitor C1 connected to the resistor R and ground; and another capacitor C2 connected to the output of CP 714 and ground. Digital to analog converter 718 converts the low pass filter output to a digital signal, selected by MUX 650 for the D signal when H_en is asserted. When H_en is deasserted, multiplexer 650 selects the N value as in FIG. 6. These examples of divisor circuits 320 are not limiting.

Figure 8:
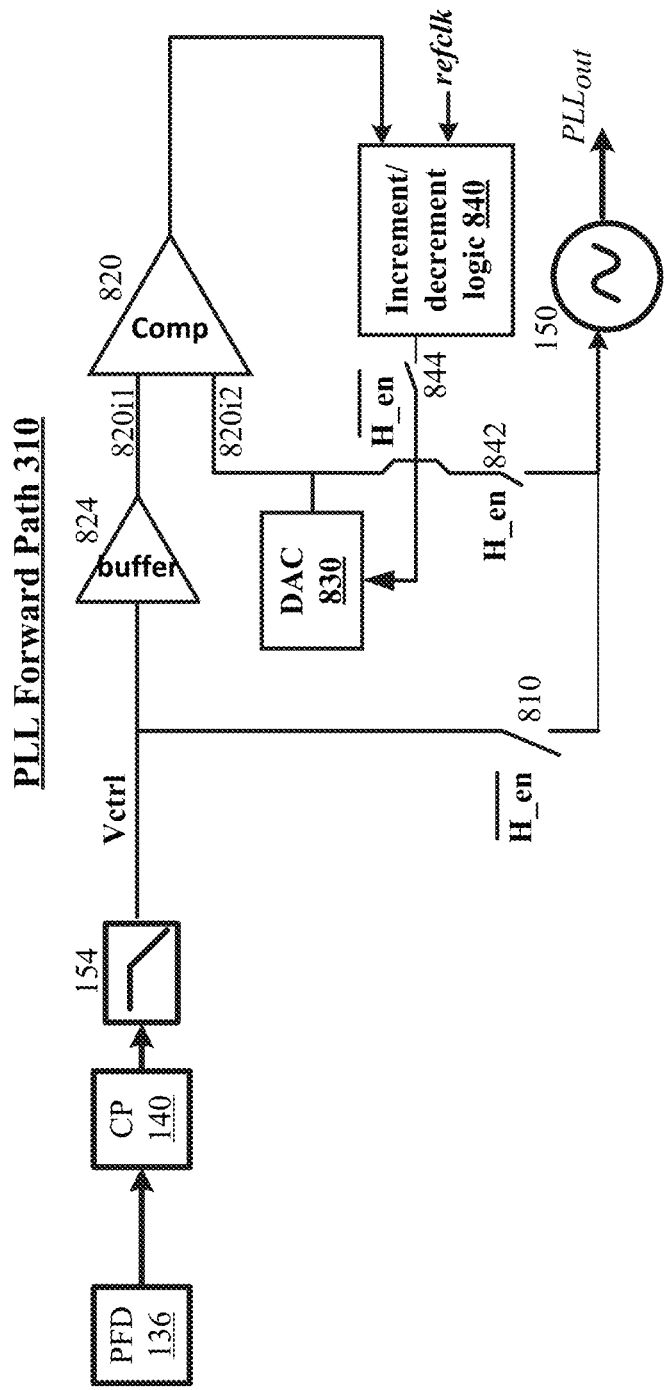

FIG. 8 illustrates one example of PLL Forward Path 310 (FIG. 3) with a holdover circuit. PFD 136, CP 140, low pass filter (LPF) 154, and VCO 150 are as in FIG. 1, except that a switch 810 is connected between LPF 154 and VCO 150. The switch is controlled by holdover-enable signal H_en, and is closed when H_en is deasserted (i.e. in normal operation). The holdover circuit includes a comparator 820 whose input 820i1 receives the Vctrl voltage output by LFP 154 and buffered by buffer amplifier 824. (Buffer 824 is optional but is recommended for isolation if LPF 154 is noise sensitive.)

The other comparator input 820i2 is connected to the input of VCO 150 through a switch 842 controlled by H_en and closed in holdover mode, i.e. when H_en is asserted. The input 820i2 is also connected to the output of DAC 830, whose input is connected to the output of increment/decrement logic 840 through switch 844 controlled by H_en to be closed in normal mode (when H_en is deasserted). Logic 840 is clocked by refclk.

Figure 1:
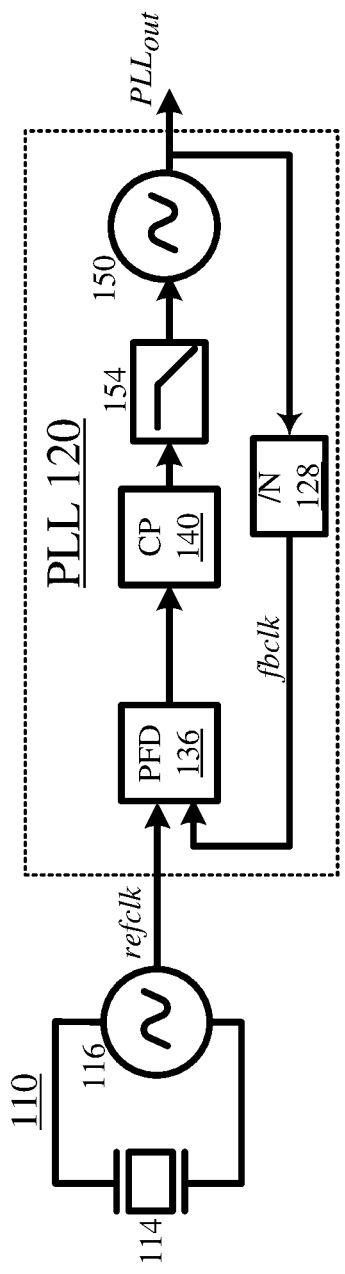
FIGS. 1 and 2 are block diagrams of clock generators according to prior art.

In normal mode, the forward path 310 and MMD 128 (FIG. 3) generate the signal $PLL_{out}$ like in FIG. 1. Also, switch 844 is closed to connect logic 840 to DAC 830. In each refclk cycle, logic 840 searches for a value to cause the comparator inputs 820i1, 820i2 to be at about equal voltages. More particularly, the comparator compares the Vctrl signal (or its buffered version) to the DAC output voltage, i.e. to the digital output of logic 840. In each refclk cycle, if the DAC output voltage is lower than Vctrl, the output of logic 840 is incremented. If the DAC output voltage is higher than Vctrl, the logic 840 output is decremented. In this way, the DAC output stays near Vctrl, which corresponds to the desired $PLL_{out}$ frequency when the PLL is locked.

In holdover mode, the DAC is disconnected from logic 840 by switch 844; the DAC's output is latched by the DAC and provided to the input of VCO 150 through switch 842. The VCO is isolated from LPF 154 by switch 810. The VCO output maintains the $PLL_{out}$ frequency corresponding to the DAC output voltage.

This forward path implementation is exemplary and not limiting.

Figure 9:
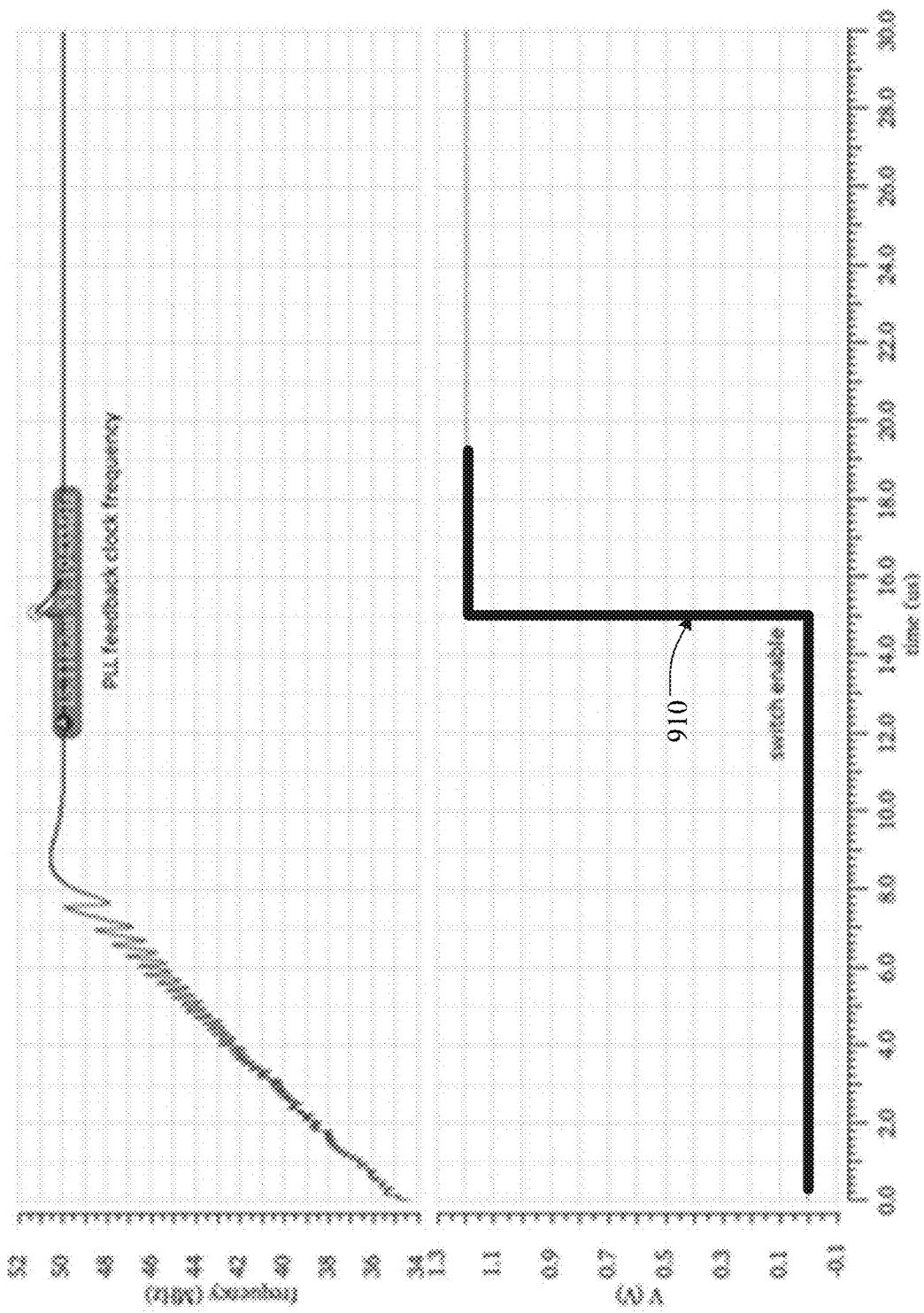
FIG. 9 is a time/frequency graph of a clock generator according to prior art.
Figure 10:
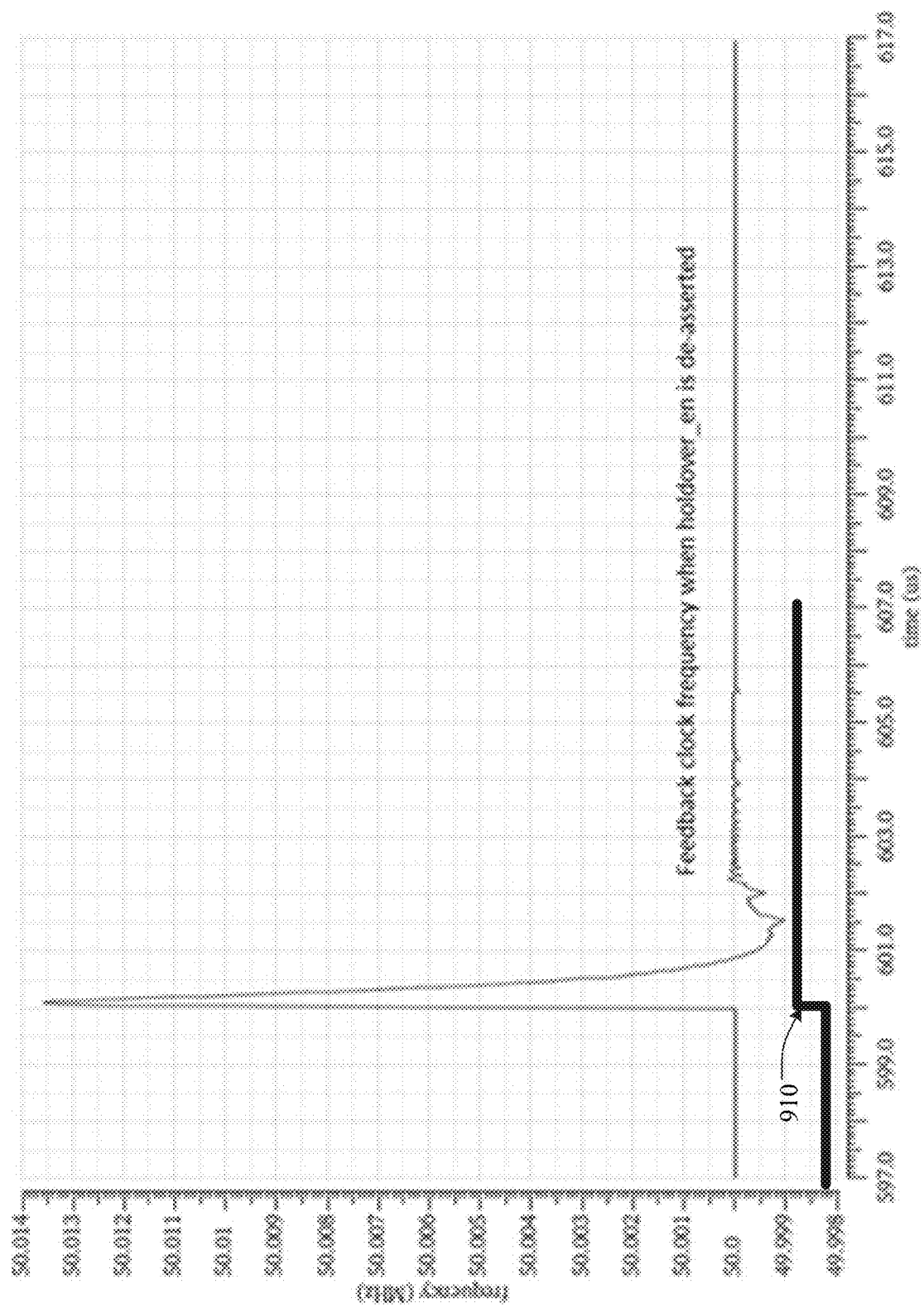
FIG. 10 is a time/frequency graph of a clock generator according to some embodiments of the present invention.

FIG. 9 is a plot of the feedback clock fbclk frequency versus time for one embodiment of the PLL of FIG. 1. FIG. 10 is a similar plot for the PLL of FIGS. 3, 6, and 8 operating according to equation (6). In both cases, ref1 and ref2 are at 50 MHz, and the reference switching operation starts on the rising edge of line 910. In FIG. 9, this happens at t=15 μs. With a time offset of 10 ns, the PLL feedback clock fbclk saw a temporary maximum frequency disturbance of 1.2 MHz, which is 2.4% of the reference frequency of 50 MHz.

In FIG. 10, the feedback clock frequency variation is only 0.013 MHz, which is 260 ppm, i.e. two orders of magnitude lower.

In some embodiments more than two oscillators 110 are provided, with more than two reference clocks.

Some embodiments of the invention are defined by the following clauses.

Clause 1 defines a method for operating a phase-locked loop (PLL), the method comprising:

operating the PLL from a first reference clock (e.g. at step 410); and then switching the PLL from a first reference clock to a second reference clock (e.g. steps 414 to 426); and operating the PLL from the second reference clock;

wherein operating the PLL from a reference clock which is either one of the first and second reference clocks, comprises generating a PLL output signal from the reference clock and generating a feedback signal from the PLL output signal;

wherein switching the PLL from the first reference clock to the second reference clock comprises:

placing the PLL in holdover mode, in which the PLL output signal is generated independently from the first and second reference clocks;

while in the holdover mode, controlling generation of the feedback signal from the PLL output signal responsively to an alignment between the second reference clock and the feedback signal.

2. The method of clause 1, wherein the feedback signal is obtained using a frequency divider circuit responsive to a divisor signal; and said controlling the generation of the feedback signal comprises controlling the divisor signal responsively to the alignment between the second reference clock and the feedback signal (e.g. alignment between fbclk and ref2 or refclk).

3. The method of clause 1 or 2 wherein the alignment between the second reference clock and the feedback signal is an alignment between rising edges of the second reference clock and the feedback signal.

4. The method of any preceding clause wherein the PLL comprises a reference input to receive the reference clock from which the PLL is operated; and the alignment between the second reference clock and the feedback signal is an alignment between rising edges of the reference clock at the reference input and the feedback signal.

5. The method of any preceding clause, wherein:
the PLL comprises a first feedback loop for generating the PLL output signal responsively to an alignment between the feedback signal and the reference clock from which the PLL is being operated;
the PLL comprises a second feedback loop for generating the divisor signal responsively to the alignment between the feedback signal and the second reference clock;
wherein when the PLL is operated from the first or second reference clock, the first feedback loop is closed, and the second feedback loop is open to generate the divisor signal independently of the feedback signal;
wherein in holdover mode, the first feedback loop is open to generate the PLL output signal independently of the first and second reference clocks, and the second feedback loop is closed to generate the divisor signal responsively to an alignment between the feedback signal and the second reference signal.

6. The method of any preceding clause, wherein the first and second reference clocks have the same frequency.

7. The method of any one of clauses 1 through 5, wherein the first and second reference clocks have different frequencies.

8. A phase-locked loop (PLL) comprising:
a first feedback loop for generating a PLL output signal responsively to an alignment between a feedback signal and a selected one of a plurality of reference clocks, wherein the feedback signal is to be generated by the PLL from the PLL output signal and a divisor signal controlling a frequency of the feedback signal based on a frequency of the PLL output signal;
a second feedback loop for generating the divisor signal responsively to an alignment between the feedback signal and one of the reference clocks when the PLL is in holdover mode;
wherein in normal mode, the first feedback loop is closed and the second feedback loop is open;
wherein in holdover mode, the first feedback loop is open and the second feedback loop is closed.

9. The PLL of clause 8, wherein in normal mode, the divisor signal is independent of the feedback signal.

10. The PLL of clause 8 or 9, wherein the alignment between the feedback signal and one of the reference clocks is an alignment between rising edges of the feedback signal and said one of the reference clocks.

11. The PLL of clause 8, 9, or 10, wherein the first and second reference clocks have the same frequency.

12. The PLL of clause 8, 9, or 10 wherein the first and second reference clocks have different frequencies.

13. The PLL of any one of clauses 8 through 12, further comprising a control circuit configured to receive a command for switching from one of the reference clocks to another one of the reference clocks, and in response to the command to:
select said other one of the reference clocks;
cause the PLL to enter holdover mode for generating the divisor signal responsively to an alignment between the feedback signal and said other one of the reference clocks; and then
exit holdover mode.

14. A clock generator comprising:
a plurality of inputs for receiving a plurality of reference clocks;
a reference clock selector for selecting one of the reference clocks;
an oscillator for generating an output clock;
a first circuit for controlling the oscillator based on the reference clock selected by the selector;
a multi-mode divider for generating a feedback signal in response to the output clock and a divisor signal;
wherein in normal mode, the first circuit is responsive to the feedback signal in controlling the oscillator to improve an alignment between the feedback signal and the selected reference clock, but in holdover mode the output clock is independent of the alignment between the feedback signal and the selected reference clock;
wherein the clock generator further comprises a divisor circuit for generating the divisor signal;
wherein in holdover mode, the divisor circuit is responsive to the selected reference clock to generate the divisor to improve the alignment between the feedback signal and the selected reference clock, but in normal mode the divisor signal is independent of the alignment between the feedback signal and the selected reference clock.

15. The clock generator of clause 14 wherein all the reference clocks have the same frequency.

16. The clock generator of clause 14 wherein at least two of the reference clocks have different frequencies.

17. The clock generator of any one of clauses 14 through 16, further comprising a control circuit configured to receive a command for switching from one of the reference clocks to another one of the reference clocks, and in response to the command to:
select said other one of the reference clocks;
cause the clock generator to enter holdover mode to improve the alignment between the feedback signal and said other one of the reference clocks; and then
exit the holdover mode.

The invention is not limited to the embodiments described above. Other embodiments and variations are within the scope of the invention, as defined by the appended claims.

The invention claimed is:
1. A method for operating a phase-locked loop (PLL), the method comprising:
(1) operating the PLL from a first reference clock; and then
(2) switching the PLL from the first reference clock to a second reference clock; and
(3) operating the PLL from the second reference clock;
wherein operating the PLL from a reference clock which is either one of the first and second reference clocks, comprises generating a PLL output signal and generating a feedback signal from the PLL output signal, wherein generating the PLL output signal comprises;
generating, by a first circuit, a first error signal, wherein:
in operation (1), the first error signal is indicative of an alignment between the first reference clock and the feedback signal;
in operation (3), the first error signal is indicative of an alignment between the second reference clock and the feedback signal; and
generating the PLL output signal responsively to the first error signal;
wherein switching the PLL from the first reference clock to the second reference clock comprises:
placing the PLL in holdover mode, in which the PLL output signal is generated independently from the first and second reference clocks;

while in the holdover mode, controlling generation of the feedback signal from the PLL output signal responsively to a second error signal indicative of an alignment between the second reference clock and the feedback signal, the second error signal being generated by a second circuit.

2. The method of claim 1, wherein the feedback signal is obtained using a frequency divider circuit responsive to a divisor signal; and
said controlling the generation of the feedback signal comprises controlling the divisor signal responsively to the alignment between the second reference clock and the feedback signal.

3. The method of claim 1 wherein:
the PLL comprises a first feedback loop for generating the PLL output signal responsively to an alignment between the feedback signal and the reference clock from which the PLL is being operated;
the PLL comprises a second feedback loop for generating a divisor signal responsively to the alignment between the feedback signal and the second reference clock;
wherein when the PLL is operated from the first or second reference clock, the first feedback loop is closed, and the second feedback loop is open to generate the divisor signal independently of the feedback signal;
wherein in the holdover mode, the first feedback loop is open to generate the PLL output signal independently of the first and second reference clocks, and the second feedback loop is closed to generate the divisor signal responsively to an alignment between the feedback signal and the second reference clock.

4. The method of claim 1 wherein the first and second reference clocks have different frequencies.

5. A phase-locked loop (PLL) comprising:
a first feedback loop for generating a PLL output signal responsively to a first error signal indicative of an alignment between a feedback signal and any selected first one of a plurality of reference clocks, wherein the feedback signal is to be generated by the PLL from the PLL output signal and a divisor signal controlling a frequency of the feedback signal based on a frequency of the PLL output signal, the first feedback loop comprising a first circuit configured to generate the first error signal;
a second feedback loop for generating the divisor signal responsively to a second error signal indicative of an alignment between the feedback signal and any second one of the plurality of the reference clocks when the PLL is in holdover mode, the second feedback loop comprising a second circuit configured to generate the second error signal;
wherein in normal mode, the first feedback loop is closed and the second feedback loop is open;
wherein in the holdover mode, the first feedback loop is open and the second feedback loop is closed.

6. The PLL of claim 5, wherein in the normal mode, the divisor signal is independent of the feedback signal.

7. The PLL of claim 5, wherein the alignment between the feedback signal and each one of the first and second reference clocks is an alignment between rising edges of the feedback signal and said each one of the first and second reference clocks.

8. The PLL of claim 5 wherein:
the first circuit is analog, the first error signal being an analog signal; and
the second circuit is digital, the second error signal being a digital signal.

9. The PLL of claim 5 wherein the first circuit comprises a phase/frequency detector, and the second circuit comprises a time-to-digital converter.

10. The PLL of claim 5, further comprising a control circuit configured to receive a command for switching from the first one of the plurality of the reference clocks to the second one of the plurality of the reference clocks, and in response to the command to:
select the second one of the plurality of the reference clocks;
cause the PLL to enter the holdover mode for generating the divisor signal responsively to an amount and sign of misalignment between the feedback signal and the second one of the plurality of the reference clocks; and then
exit the holdover mode.

11. The method of claim 1, wherein:
the first second is analog, the first error signal being an analog signal;
the second circuit is digital, the second error signal being a digital signal.

12. The method of claim 11, wherein the first circuit comprises a phase/frequency detector, and the second circuit comprises a time-to-digital converter.

13. The method of claim 1, wherein:
in normal mode in which the PLL is operated from the reference clock, the PLL output signal is generated by a forward path comprising the first circuit, the forward path receiving the feedback signal and the reference clock and generating the PLL output signal; and
the second circuit is not part of the forward path.

14. The method of claim 13, wherein the feedback signal is obtained, in the normal and holdover modes, using a frequency divider circuit responsive to a divisor signal;
in the holdover mode, the divisor signal is generated responsively to the second error signal without using the forward path.

15. A phase-locked loop (PLL) configured to operate according to the method of claim 1, the PLL comprising the first and second circuits.

16. The PLL of claim 15, wherein:
the first circuit is analog, the first error signal being an analog signal;
the second circuit is digital, the second error signal being a digital signal.

17. The PLL of claim 16, wherein the first circuit comprises a phase/frequency detector, and the second circuit comprises a time-to-digital converter.

18. The PLL of claim 15, wherein the PLL comprises a forward path comprising the first circuit, the forward path receiving the feedback signal and the reference clock and generating the PLL output signal; and the second circuit is not part of the forward path.

19. The PLL of claim 15, further comprising a frequency divider circuit responsive to a divisor signal; and
said controlling the generation of the feedback signal in the holdover mode comprises controlling the divisor signal responsively to the second error signal.

20. The PLL of claim 18, further comprising a frequency divider circuit responsive to a divisor signal to generate the feedback signal in normal mode in which the PLL is operated from the reference clock, and in the holdover mode;
wherein in the holdover mode, the divisor signal is generated responsively to the second error signal without using the forward path.

* * * * *